United States Patent
Tuncer et al.

(10) Patent No.: US 8,473,876 B2
(45) Date of Patent: Jun. 25, 2013

(54) LITHOGRAPHY AWARE TIMING ANALYSIS

(75) Inventors: Emre Tuncer, Santa Cruz, CA (US);
Hui Zheng, Round Rock, TX (US);
Vivek Raghavan, Mountain View, CA (US); Anirudh Devgan, Austin, TX (US); Amir Ajami, Sunnyvale, CA (US); Alessandra Nardi, Hayward, CA (US); Tao Lin, Sunnyvale, CA (US); Pramod Thazhathethil, Bangalore (IN); Alfred Wong, Brookline, MA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/781,054

(22) Filed: Jul. 20, 2007

(65) Prior Publication Data
US 2008/0052653 A1 Feb. 28, 2008

Related U.S. Application Data

(60) Provisional application No. 60/820,064, filed on Jul. 21, 2006.

(51) Int. Cl.
*G06F 17/50* (2006.01)
(52) U.S. Cl.
USPC .......... 716/54; 716/51; 716/55; 716/113

(58) Field of Classification Search
USPC .................... 716/51, 54–55, 113
See application file for complete search history.

(56) References Cited

U.S. PATENT DOCUMENTS

| | | | | |
|---|---|---|---|---|
| 5,659,630 A | * | 8/1997 | Forslund | 382/149 |
| 7,383,521 B2 | * | 6/2008 | Smith et al. | 716/6 |
| 7,441,211 B1 | * | 10/2008 | Gupta et al. | 716/2 |
| 7,458,045 B2 | * | 11/2008 | Cote et al. | 716/5 |
| 7,509,624 B2 | * | 3/2009 | Melvin et al. | 716/21 |
| 7,533,359 B2 | * | 5/2009 | Scheffer et al. | 716/5 |
| 2006/0150132 A1 | * | 7/2006 | Gupta | 716/5 |
| 2007/0094623 A1 | * | 4/2007 | Chen et al. | 716/4 |
| 2007/0168898 A1 | * | 7/2007 | Gupta et al. | 716/9 |
| 2008/0028345 A1 | * | 1/2008 | Suri et al. | 716/2 |
| 2008/0052646 A1 | * | 2/2008 | Tuncer et al. | 716/4 |

* cited by examiner

*Primary Examiner* — Naum Levin
(74) *Attorney, Agent, or Firm* — Kilpatrick Townsend & Stockton LLP

(57) ABSTRACT

A method for performing timing analysis includes receiving information specifying an integrated circuit. A neighborhood of shapes associated with the integrated circuit is then determined. Delay information associated with the integrated circuit is generated based on the neighborhood of shapes. The neighborhood of shapes may be determined by determining a first set of spacings to a boundary of a first cell from an internal shape. A second set of spacings may be determined from the boundary of the first cell to a shape of a second cell. A lithography process may be characterized using the first and second set of spacings.

17 Claims, 11 Drawing Sheets

LITHOGRAPHY AWARE TIMING ANALYSIS

CROSS-REFERENCES TO RELATED APPLICATIONS

This application claims the benefit of and priority to U.S. Provisional Application No. 60/820,064, filed Jul. 21, 2006 and entitled "Lithography Aware Leakage and Timing Analysis," the entire disclosure of which is hereby incorporated by reference for all purposes.

This application is related to co-pending U.S. patent application Ser. No. 11/781,043, filed concurrently and entitled "Lithography Aware Leakage Analysis," the entire disclosure of which is hereby incorporated by reference for all purposes.

BACKGROUND OF THE INVENTION

The present invention relates to the field of electronic design automation. More specifically, the present invention relates to electronic design automation including lithography aware leakage and timing analysis.

Leakage has become a primary concern in the consumption of power in semiconductor chips. Timing also is a concern because it drives the capability of the circuitry to make the calculations rapidly enough to meet customer's requirements.

Historically power and timing were deterministically calculated often considering worst case analysis. Over time it has become obvious that deterministic calculation results in insufficient yield, especially as each individual circuit component is considered from a worst case perspective. Instead, statistical analysis may be used, realizing that a range of operation distribution exists for which most of the distribution well meets customer requirements. This statistical analysis has come to be used on both timing analysis and more recently on leakage analysis.

Leakage is a function of the overall transistor gate width in a given circuit. Low threshold voltage FETs have significantly higher leakage and correspondingly higher performance. For multi-threshold voltage processes there are typically two levels. A low threshold (VT) device for high performance and a normal threshold device for lower power and lower performance. By selectively utilizing low threshold devices only where needed, the performance requirement is met while keeping the power consumption relatively low. One method to approximate leakage current which will be utilized by the chip is by totaling the cumulative FET gate width for each threshold device.

There are systematic variations and random variations which affect timing and power. An example of a systematic variation would be lithography defocus since this is a controllable parameter that affects the entire chip. A random variation would be due to a change in the number of dopant molecules since these can vary on a transistor by transistor basis. These variations impact the overall design and can be used statistically to tune the design to meet timing and leakage requirements.

Accordingly, what is desired are improved methods and apparatus for solving the problems discussed above. Additionally, what is desired are improved methods and apparatus for reducing some of the drawbacks discussed above.

BRIEF SUMMARY OF THE INVENTION

The present invention relates to providing electronic design automation with lithographic aware leakage and timing analysis.

In various embodiments, a method for performing leakage calculations includes receiving information specifying an integrated circuit. A neighborhood of shapes associated with the integrated circuit is determined. Leakage information associated with the integrated circuit is generated based on the neighborhood of shapes.

Determining the neighborhood of shapes may include determining a first set of spacings to a boundary of a first cell from an internal shape. A second set of spacings may be determined from the boundary of the first cell to a shape of a second cell. A lithography process may be characterized using the first and second set of spacings. In some embodiments, characterizing the lithography process may include characterizing effective transistor channel lengths as a function of the first and second set of spacings.

A mapping may be generated from the first and second set of spacings to the lithography process. A mapping may be generated from the first and second set of spacings to leakage. Leakage of the first cell may be calculated based on the first and second set of spacing. The internal shape may include a polysilicon transistor shape. The internal shape may also include a wiring shape.

In one embodiment, a computer program product is stored on a computer readable medium for performing leakage calculations. The computer program product includes code for receiving information specifying an integrated circuit, code for determining a neighborhood of shapes associated with the integrated circuit, and code for generating leakage information associated with the integrated circuit based on the neighborhood of shapes.

In a further embodiment, a system for performing leakage calculations includes a processor and a memory. The memory is coupled to the processor and stores a set of instructions which when executed by the processor cause the processor to receive information specifying an integrated circuit, determine a neighborhood of shapes associated with the integrated circuit, and generate leakage information associated with the integrated circuit based on the neighborhood of shapes.

In various embodiments, a method for performing delay calculations includes receiving information specifying an integrated circuit. A neighborhood of shapes associated with the integrated circuit is determined. Delay information associated with the integrated circuit is generated based on the neighborhood of shapes.

Determining the neighborhood of shapes may include determining a first set of spacings to a boundary of a first cell from an internal shape. A second set of spacings may be determined from the boundary of the first cell to a shape of a second cell. A lithography process may be characterized using the first and second set of spacings. In some embodiments, characterizing the lithography process may include characterizing effective transistor channel lengths as a function of the first and second set of spacings.

A mapping may be generated from the first and second set of spacings to the lithography process. A mapping may be generated from the first and second set of spacings to delay. Delay of the first cell may be calculated based on the first and second set of spacing. The internal shape may include a polysilicon transistor shape. The internal shape may also include a wiring shape.

In one embodiment, a computer program product is stored on a computer readable medium for performing delay calculations. The computer program product includes code for receiving information specifying an integrated circuit, code for determining a neighborhood of shapes associated with the integrated circuit, and code for generating delay information associated with the integrated circuit based on the neighborhood of shapes.

In a further embodiment, a system for performing delay calculations includes a processor and a memory. The memory is coupled to the processor and stores a set of instructions which when executed by the processor cause the processor to receive information specifying an integrated circuit, determine a neighborhood of shapes associated with the integrated circuit, and generate delay information associated with the integrated circuit based on the neighborhood of shapes.

In various embodiments, a method for calculating neighborhood spacings includes receiving information specifying a plurality of cells. A first set of spacings from a first shape associated with a first cell to a boundary associated with the first cell is determined. A second set of spacings from the boundary to a second shape associated with a second cell is determined. A neighborhood of shapes is generated based on the first and second set of spacings.

In one embodiment, a computer program product is stored on a computer readable medium for calculating neighborhood spacings. The computer program product includes code for receiving information specifying a plurality of cells, code for determining a first set of spacings from a first shape associated with a first cell to a boundary associated with the first cell, code for determining a second set of spacings from the boundary to a second shape associated with a second cell, and code for generating a neighborhood of shapes based on the first and second set of spacings.

In various embodiments, a method for determining circuit performance includes receiving information specifying an integrated circuit. A neighborhood of shapes of a plurality of cells associated with the integrated circuit is determined. A first set of spacings to a boundary of at least one of the cells from an internal shape is determined. A second set of spacings from the boundary the cell to a shape associated with at least one of the plurality of cells is determined. A lithography process is characterized using the first and second set of spacings. A mapping is generated from the first and second set of spacings to leakage. Leakage of the cells is calculated based on the first and second set of spacings. A mapping is generated from the first and second set of spacings to delay. Delay of the cells is calculated based on the first and second set of spacings. Performance information associated with the integrated circuit is generated based on electrical connections between the cells and the calculated delays and leakages of the cells.

In one embodiment, a computer program product is stored on a computer readable medium for determining circuit performance. The computer program product includes code for receiving information specifying an integrated circuit, code for determining a neighborhood of shapes of a plurality of cells associated with the integrated circuit, code for determining a first set of spacings to a boundary of at least one of the cells from an internal shape, code for determining a second set of spacings from the boundary the cell to a shape of at least one of the plurality of cells, code for characterizing a lithography process using the first and second set of spacings, code for generating a mapping from the first and second set of spacings to leakage, code for calculating leakage of the cells based on the first and second set of spacings, code for generatings a mapping from the first and second set of spacings to delay, code for calculating delay of the cells based on the first and second set of spacings, and code for generating performance information associated with the integrated circuit based on electrical connections between the cells and the calculated delays and leakages of the cells.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings.

DETAILED DESCRIPTION OF THE INVENTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments, examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles described herein.

In general, Optical Proximity Correction (OPC) is a step in the manufacturing process that semiconductor manufactures employ to improve the quality of high-performance integrated circuit designs such as microprocessors. The overall lithography process involves projecting a circuit design from a mask, through a complex lens system that reduces the image onto a wafer that will later be divided into individual chips. These circuits contain tiny metal and polysilicon lines on the order of 100 nm in width, in some cases smaller than the wavelength of the light used to print them.

Several problems arise from the small size of these features and the finite size and inherent limitations of the imaging system. First, the high frequency components required to reproduce the sharp edges in polygon features may fall outside the lens. Secondly, stray light entering the opening from one shape may find its way into another shape in close proximity, leading to a complex interaction of the electric fields of adjacent polygons. Thus, the final shapes will have rounded corners and may bulge towards adjacent shapes, possibly shorting together and rendering the chip defective if the situation is bad enough.

Optical Proximity Correction (OPC) is the process of modifying the polygons that are drawn by the designers to compensate for the non-ideal properties of the lithography process. Given the shapes desired on the wafer, the mask is modified to improve the reproduction of the critical geometry. This is done by dividing polygon edges into small segments, moving the segments around, and by adding additional small polygons to strategic locations in the layout. The addition of OPC features to the mask layout allows for tighter design rules and significantly improves process reliability and yield. The following figures demonstrate the use of and results of OPC.

Figure 1:
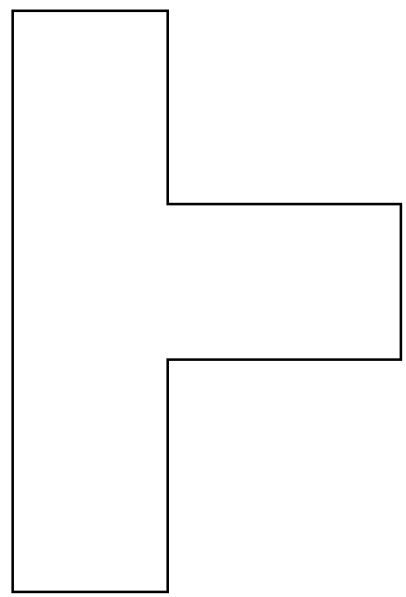
FIG. 1 illustrates a view of an original desired shape of an exemplary portion of a circuit under design.

FIG. 1 illustrates a view of an original desired shape of an exemplary portion of a circuit under design. This shape normally has significant shortening on its ends and rounding of its corners during fabrication. OPC adds dumbbell shapes to prevent foreshortening and narrows or widens pieces to result in the proper final shapes.

Figure 2:
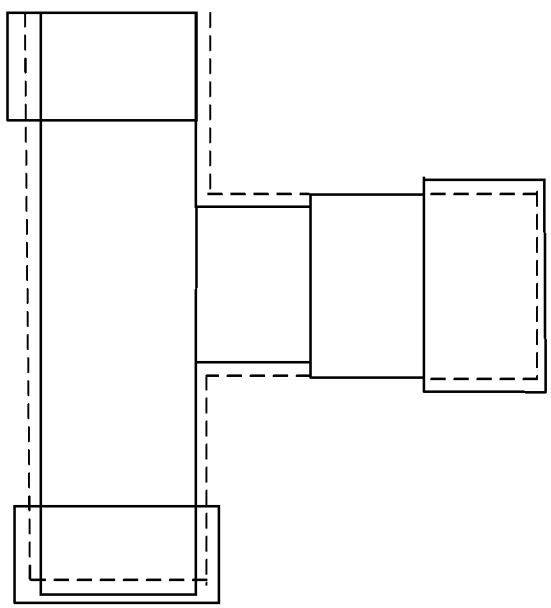
FIG. 2 illustrates a view of a desired shape with optical proximity correction (OPC) of the exemplary portion of the circuit under design of FIG. 1.

FIG. 2 illustrates a view of a desired shape (dotted line) with optical proximity correction of the exemplary portion of the circuit under design of FIG. 1. The solid line formed by the outline of the shapes indicates the OPC shape to accomplish the desired final shape.

Figure 3:
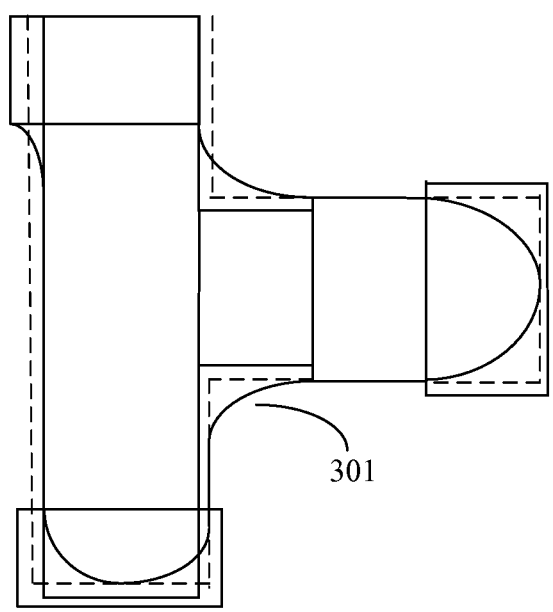
FIG. 3 illustrates a view of the desired shape of FIG. 2 including a final fabricated semiconductor shape.

FIG. 3 illustrates a view of the desired shape of FIG. 2 including a final fabricated semiconductor shape. A line 301 indicates the final fabricated shape. Without using OPC, the final shape would have looked much worse and would not have approximated the original desired shape.

In various embodiments, systems and methods provide electronic design simulation using the neighborhood environment of cells of the design to determine the impact on both leakage and timing. The disclosed concept utilizes knowledge both about the individual cells and about the neighborhood around the cells and the resulting impact on the fabricated semiconductors.

As discussed above, Optical proximity correction (OPC) considers the on chip shapes and the immediately adjacent shapes and corrects them to have the final fabricated shape more closely reflect the original design intent. OPC, however, is insufficient to account for defocus associated with having multiple shapes adjacent to one another. As an example, wires with different spacings have different defocus sensitivities. Likewise, effective channel lengths (Leff) depend on the number and closeness of other nearby channels.

In various embodiments, an electronic design automation (EDA) system identifies distances within individual cells. The distance between a specific cell and its neighbor, along with information on that neighbor, is then factored into the leakage and timing analysis.

Figure 4:
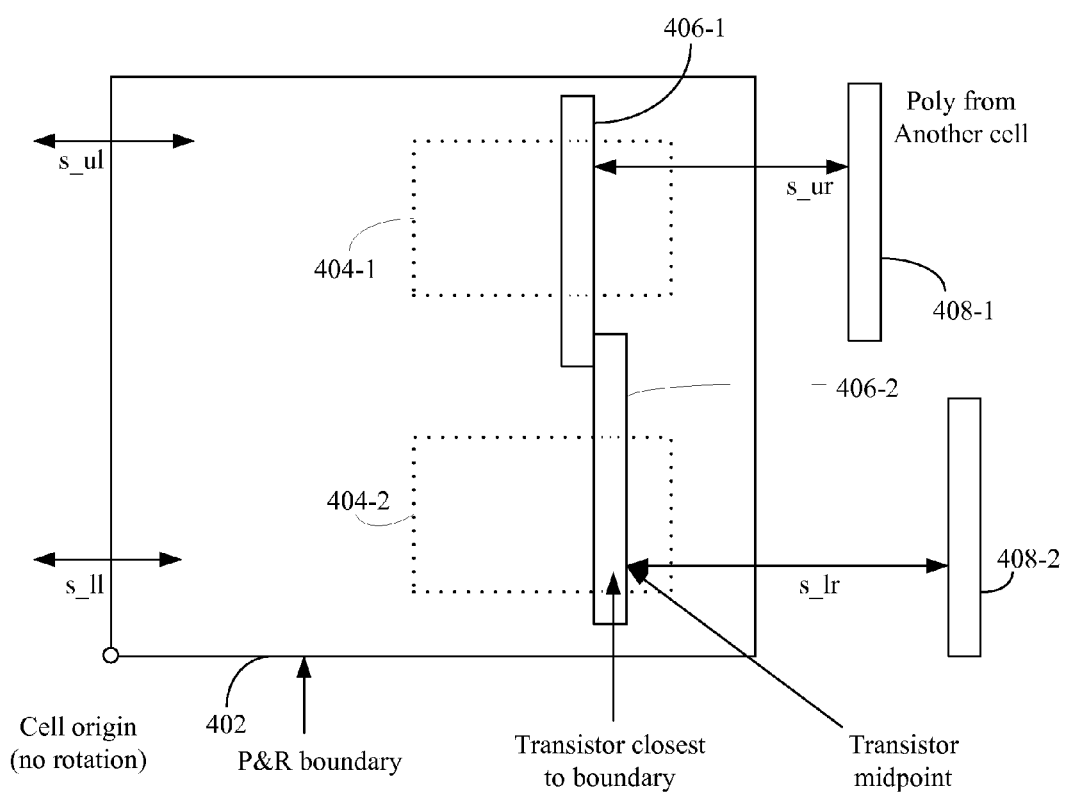
FIG. 4 illustrates a view of a circuit under design with lithography characterization and spacing definition in one embodiment according to the present invention.

FIG. 4 illustrates a view of a circuit under design with lithography characterization and spacing definition. A cell outline is used for a place and route (P&R) boundary 402. As illustrative examples, shapes 404-1 and 404-2 of corresponding transistors are near the boundary 402 of the cell. Because cells are typically assembled in a horizontally adjacent fashion, only this direction is described. However, the present invention is not limited to one dimension, and may include, for example, two dimensional adjacency calculations. Spacings {s} are determined. As an example of the spacing, a spacing s_ur denotes the upper-right space between polysilicon shape 406-1 defining transistor channels in the boundary 402 and adjacent polysilicon shape 408-1. Similarly, spacings s_lr, s_ul, and s_ll denote lower-right, upper-left, and lower-left spacings respectively. For clarity only two transistors 404 are shown, but the spacings s_ul and s_ll are spacings between two transistors and two polysilicon shapes that are not shown. In a two dimensional analysis, spacings for the right and left top and right and left bottom may be determined. Although the description is directed to transistors and polysilicon transistor channel shapes, the analysis may be applied to other elements, such as wiring shape.

Figure 5:
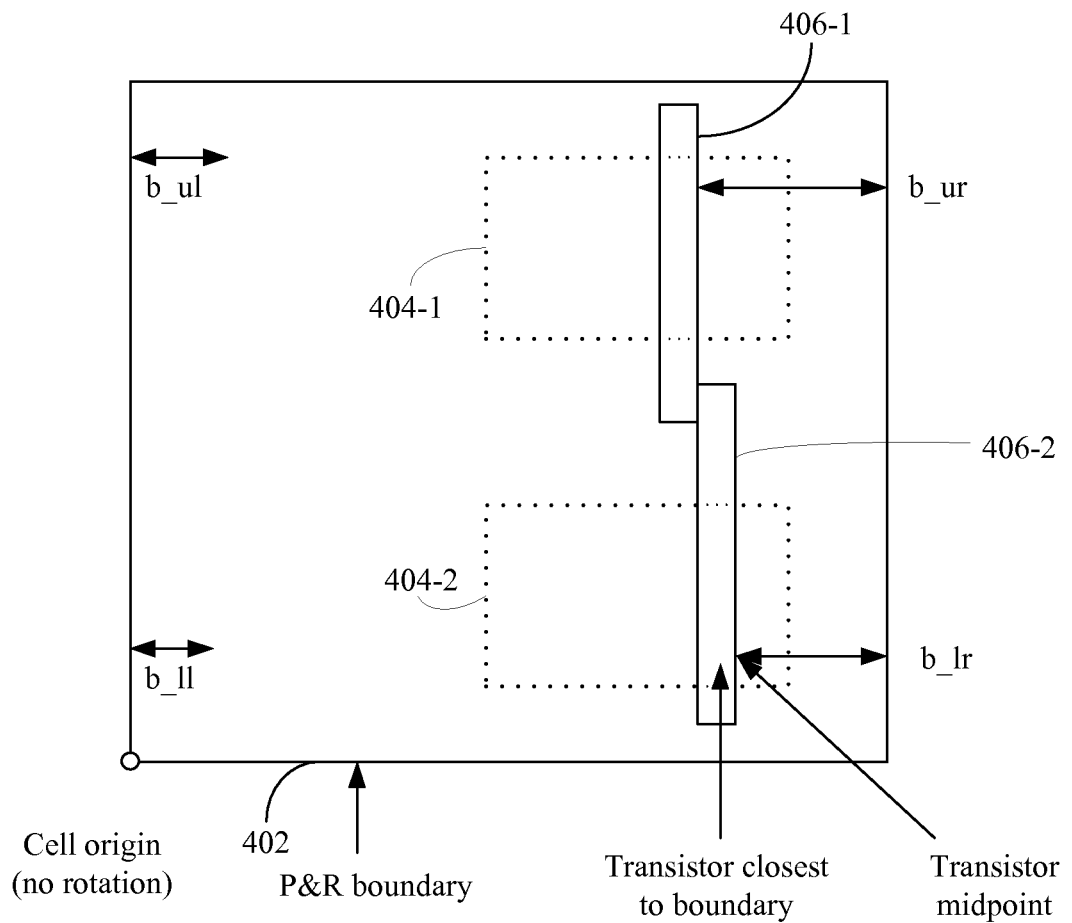
FIG. 5 illustrates a view of a circuit under design showing boundary distances in one embodiment according to the present invention.

To determine the information described in FIG. 4, the distances {b} within a cell, to nearby cell boundaries 402 are also determined. FIG. 5 illustrates a view of a circuit under design showing boundary distances to the boundary 402 from within a cell. For instance, the distance b_ur denotes the distance from within the cell to the upper-right boundary, again for polysilicon shapes. Similarly distances b_lr, b_ul, and b_ll denote lower-right, upper-left, and lower-left distances respectively. This information is collected for all cells in the library.

Figure 6:
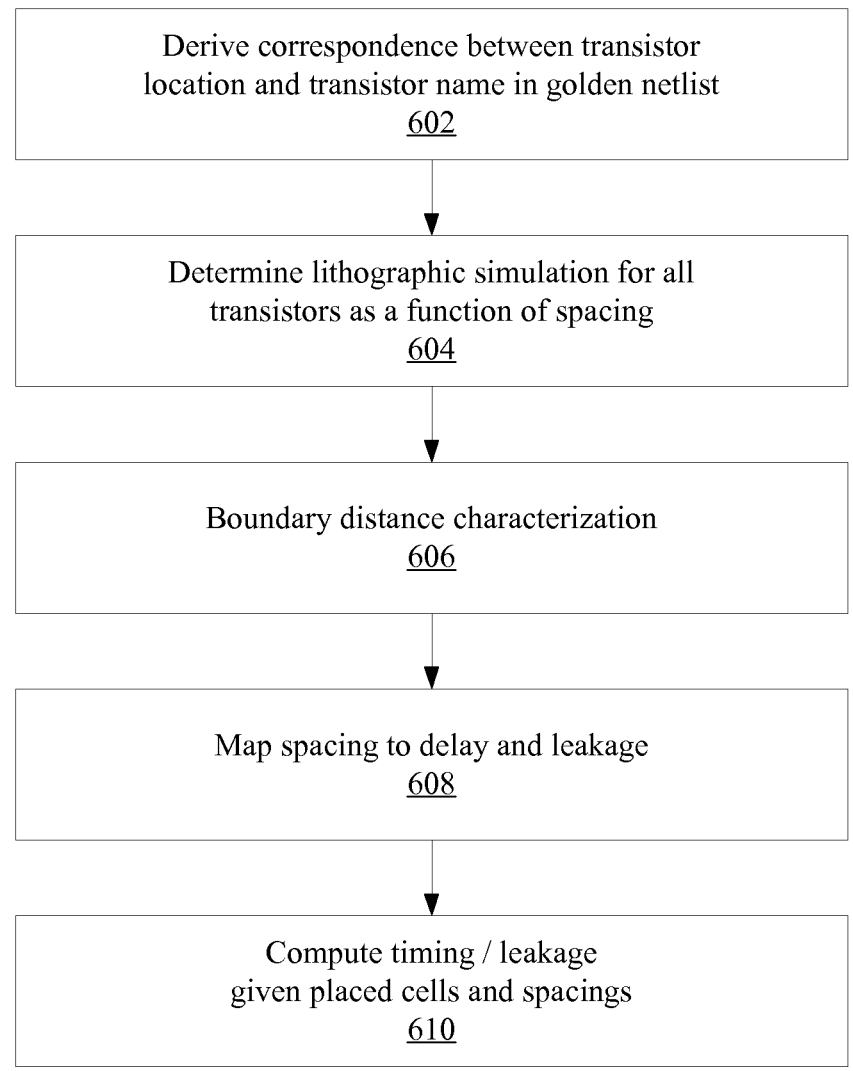
FIG. 6 illustrates a flow chart of a methodology of simulating a circuit under test using neighboring cells in one embodiment according to the present invention.

FIG. 6 illustrates a flow chart of a methodology of simulating a circuit under test using neighboring cells. The processing depicted in FIG. 6 may be performed by software modules (e.g., instructions or code) executed by a processor of a computer system, by hardware modules of the computer system, or combinations thereof.

Once the internal spacings {b} and the spacings {s} to neighboring cells, for a specific design, are considered, the appropriate delay and leakage may be calculated, based on a given defocus. The methodology of this calculation is now described.

Steps 602, 604, 606 and 608 are pre-characterization steps. The EDA system derives correspondence between transistor locations and transistor names in a golden netlist (step 602) as described below in conjunction with FIG. 7. This is a layout versus schematic (LVS) process. The EDA system performs a lithography simulation process using a boundary distance spacing (step 604) as described below in conjunction with FIG. 8. One example would be the characterization of effective channel lengths as a function of spacings. The EDA system characterizes boundary distances (step 606) as described below in conjunction with FIG. 9. In one embodiment delay or leakage is characterized as a function of the effective channel lengths. The EDA system then maps spacing to effective channel length and finally to delay and leakage (step 608) as described below in conjunction with FIG. 10.

Step 610 is a timing and leakage analysis step. The EDA system computes timing and leakage given the channel lengths determined based on the placed cells and spacings (step 610).

The steps 602, 604, 606 and 608 are now described in conjunction with FIGS. 7, 8, 9, and 10, respectively.

Figure 7:
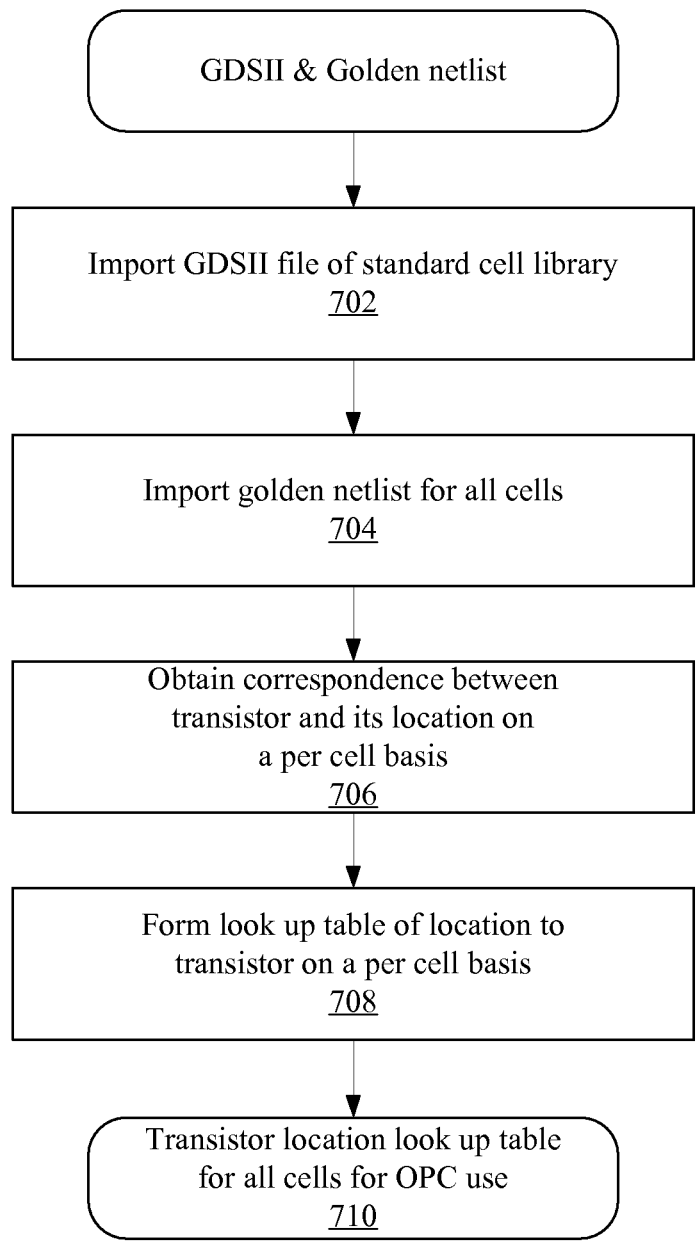
FIG. 7 illustrates a flow chart of a layout versus schematic methodology in the methodology of FIG. 6 in one embodiment according to the present invention.

FIG. 7 illustrates a flow chart of the deriving step 602. The result of this process is a transistor look up table that identifies location on a per cell basis. The EDA system imports a graphic design system file, such as a GDSII file, of a standard library (step 702), and imports the golden netlist for all cells as well (step 704). The EDA system determines correspondence between a transistor by name and the transistor's location in the cell (step 706). The EDA system forms a look up table (LUT) describing the locations of the transistors on a per cell basis (step 708). This transistor location look up table is used for all cells for OPC (block 710).

Figure 8:
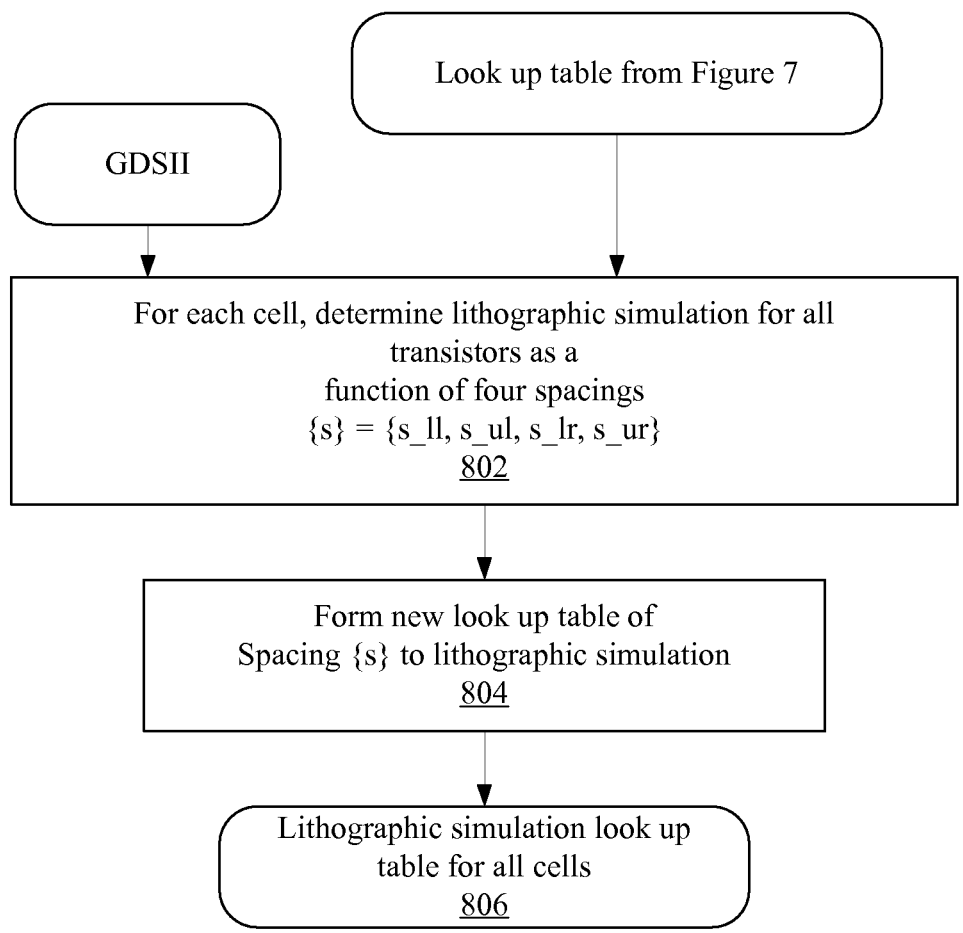
FIG. 8 illustrates a flow chart of a lithography characterization methodology of the methodology of FIG. 6 in one embodiment according to the present invention.

FIG. 8 illustrates a flow chart of a lithography simulation methodology of the step 604. The resulting output is a new look up table describing the spacings based on the lithographic simulation for each cell. The EDA system runs a lithographic simulation for all transistors as a function of the spacing {s} for each cell (block 802). One embodiment characterizes the effective channel lengths versus spacing for all cells. The EDA system forms a look up table from the spacings {s} run in the lithographic simulation (block 804). The lithographic simulation look up table is formed for all cells (block 806).

Figure 9:
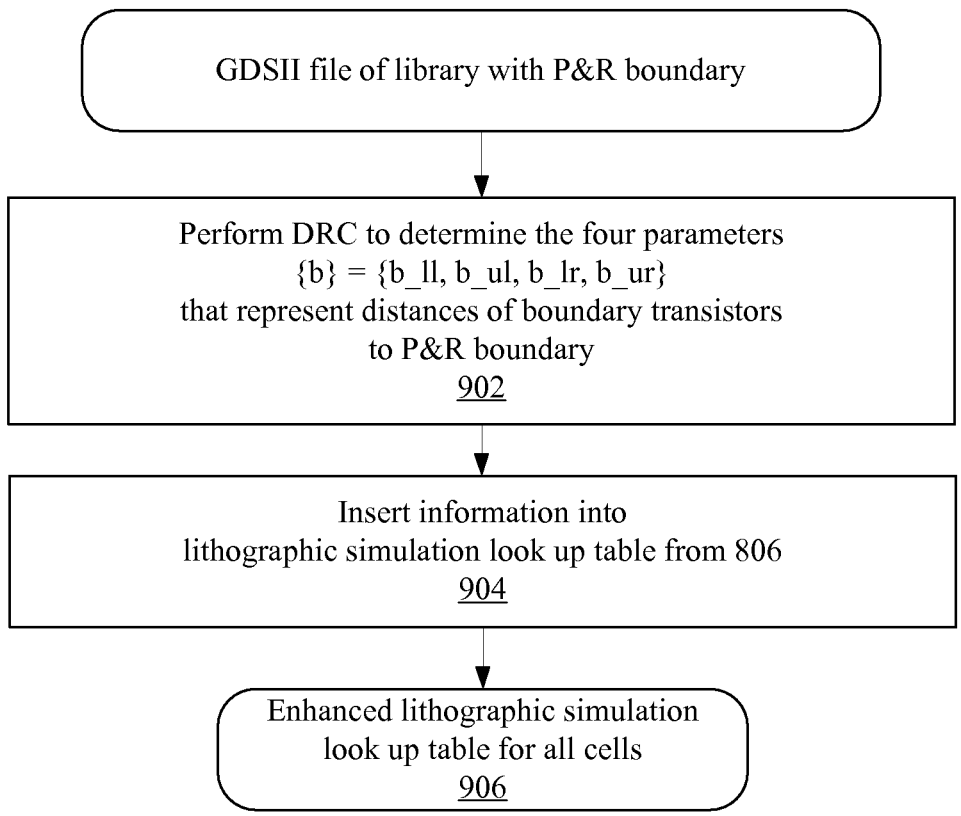
FIG. 9 illustrates a flow chart of a boundary distance characterization methodology of the methodology of FIG. 6 in one embodiment according to the present invention.

FIG. 9 illustrates a flow chart of the boundary distance characterization step 606 of FIG. 6. One embodiment determines the spacing from the transistor channels to the boundary of the cell. The resulting output is an enhancement to the look up table where boundary distances are included for each cell. Using the LUT from step 806, the EDA system performs a design rule check (DRC) to determine the distances {b} that represent the distances of the boundary transistors 406 to the P&R boundary 402 (step 902). The EDA system inserts the distances {b} into the lithographic simulation look up table generated in step 806 (step 904) to form an enhanced lithographic simulation look up table for all cells (step 906).

Figure 10:
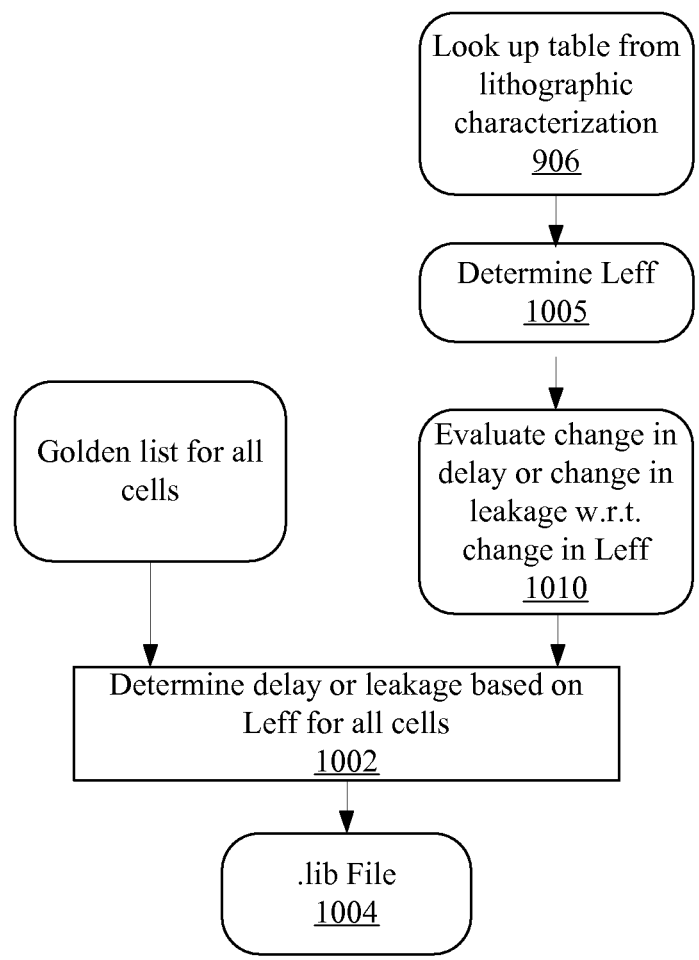
FIG. 10 illustrates a flow chart of a standard cell characterization methodology of the methodology of FIG. 6 in one embodiment according to the present invention.

FIG. 10 illustrates a flow chart of a standard cell characterization step 608 of FIG. 6. The resulting output is a library (lib) file with the delay or leakage information incorporated. The EDA system determines the Leff (step 1005) based on the spacing {s} to the surrounding structures. The change in delay or the change in leakage based on a change in Leff is determined (step 1010). The delay or leakage for each cell based on each transistor in each cell is determined based on each transistors Leff (step 1002). These Leff values are those determined based on the spacing {s}. A library file with the delay and leakage information (step 1004) is generated.

The calculation of step 1002 may be accomplished by either direct calculation, where all of the combinations of four spacings are traversed. Alternatively the calculation can be accomplished by relating the spacings to effective channel lengths and then in turn relating them to leakage or delay. By example the direct delay calculation can be represented as follows:

$$D = f(s\_ul, s\_ll, s\_ur, s\_lr)$$

Another embodiment has the delay related to the effective channel lengths as follows:

$$D = f(g(s))$$

The terms in this equation indicate that the delay "D" is a function of the effective channel length "g", which is in turn a function of the spacing "s" between channels.

For two dimensional analyses, the spacing {s} and distances {b} include distances from the top and bottom of the cell. The width of channels and interconnections are also accounted for in the analysis because of the impact of the side of a channel or interconnection to neighboring devices.

Figure 11:
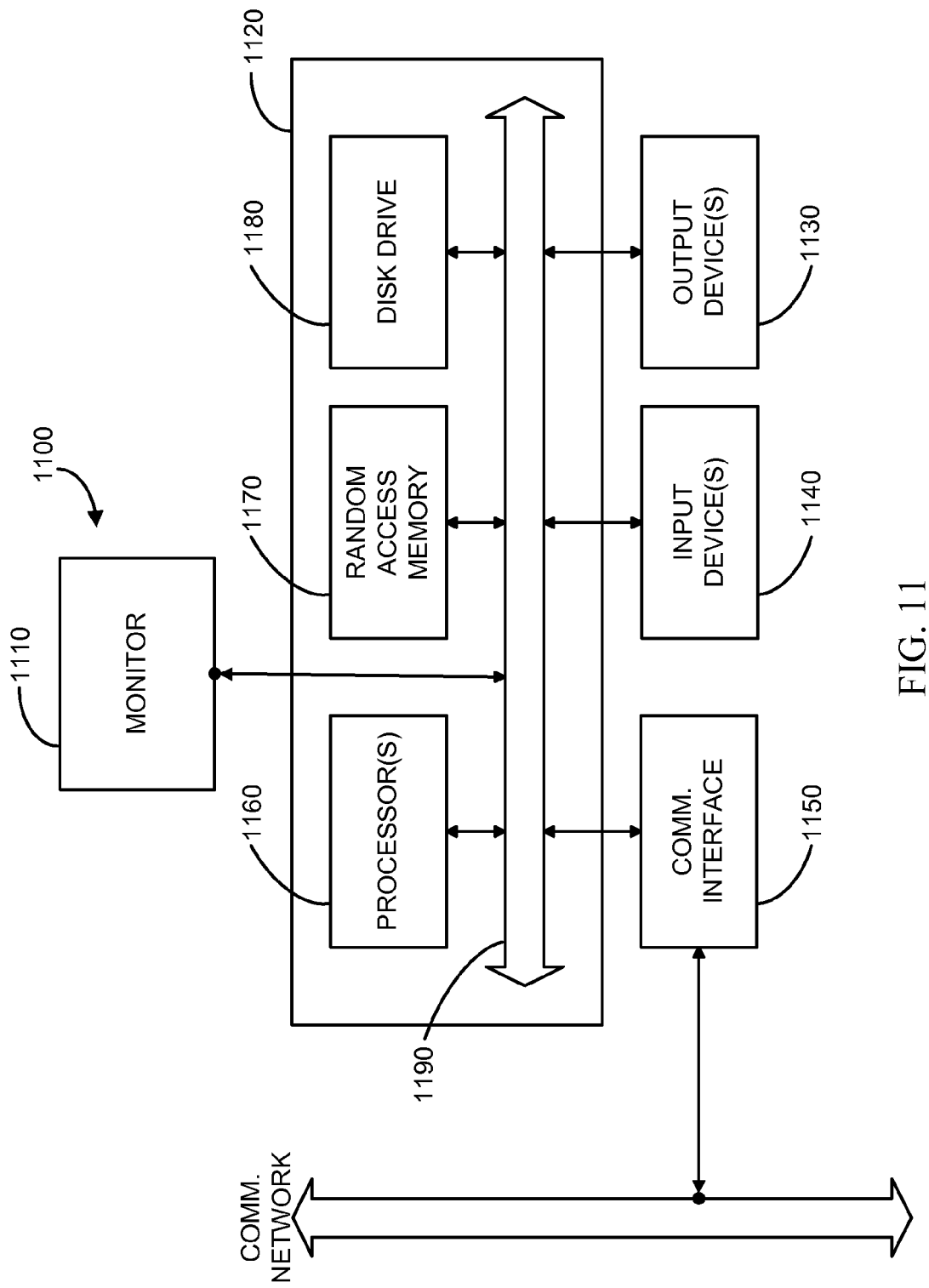
FIG. 11 is a block diagram of typical computer system according to an embodiment of the present invention.

FIG. 11 is a simplified block diagram of a computer system 1100 that may incorporate embodiments of the present invention. FIG. 11 is merely illustrative of an embodiment incorporating the present invention and does not limit the scope of the invention as recited in the claims. One of ordinary skill in the art would recognize other variations, modifications, and alternatives.

In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1130 include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1130 are typically embodied as a computer mouse, a trackball, a track pad, a joystick, wireless remote, drawing tablet, voice command system, eye tracking system, and the like. User input devices 1130 typically allow a user to select objects, icons, text and the like that appear on the monitor 1110 via a command such as a click of a button or the like.

User output devices 1140 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other micro processors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for programming a device. The scope of the invention should, therefore, be determined not with reference to the above description, but instead should be determined with reference to the pending claims along with their full scope or equivalents.

The present invention can be implemented in the form of control logic in software or hardware or a combination of both. The control logic may be stored in an information storage medium as a plurality of instructions adapted to direct an information-processing device to perform a set of steps disclosed in embodiments of the present invention. Based on the disclosure and teachings provided herein, a person of ordinary skill in the art will appreciate other ways and/or methods to implement the present invention.

The embodiments discussed herein are illustrative of one or more examples of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, the present descriptions and drawings should not be considered in a limiting sense, as it is understood that the present invention is in no way limited to only the embodiments illustrated.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A method for performing delay calculations, the method comprising:
    receiving, at one or more computer systems, information specifying an integrated circuit;
    determining, with the one or more processors associated with the one or more computer systems, a neighborhood of shapes associated with the integrated circuit, wherein determining the neighborhood of shapes comprises:
    determining a first set of spacings between a boundary of an internal shape of a first cell and a boundary of the first cell;
    determining a second set of spacings between the boundary of the first cell and a boundary of a shape of a second cell; and
    characterizing a lithography process using the first and second set of spacings; and
    generating, with the one or more processors associated with the one or more computer systems, delay information associated with the integrated circuit based on calculating delay in the integrated circuit using a simulation of the characterized lithography process.

2. The method of claim 1 wherein characterizing the lithography process comprises characterizing effective transistor channel lengths as a function of the first and second set of spacings.

3. The method of claim 1 further comprising generating a mapping from the first and second set of spacings to the lithography process.

4. The method of claim 1 further comprising generating a mapping from the first and second set of spacings to delay.

5. The method of claim 4 further comprising calculating delay of the first cell based on the first and second set of spacing.

6. The method of claim 1 wherein the internal shape comprises a polysilicon transistor shape.

7. The method of claim 1 wherein the internal shape comprises a wiring shape.

8. A computer program product stored on a non-transitory computer readable medium for performing delay calculations, the computer program product comprising:
    code for receiving information specifying an integrated circuit;
    code for determining a neighborhood of shapes associated with the integrated circuit, wherein determining the neighborhood of shapes comprises:

determining a first set of spacings between a boundary of an internal shape of a first cell and a boundary of the first cell;

determining a second set of spacings between the boundary of the first cell and a boundary of a shape of a second cell; and characterizing a lithography process using the first and second set of spacings; and code for generating delay information associated with the integrated circuit based on calculating delay in the integrated circuit using a simulation of the characterized lithography process.

9. The computer program product of claim 8 wherein the code for characterizing the lithography process comprises code for characterizing effective transistor channel lengths as a function of the first and second set of spacings.

10. The computer program product of claim 8 further comprising code for generating a mapping from the first and second set of spacings to the lithography process.

11. The computer program product of claim 8 further comprising code for generating a mapping from the first and second set of spacings to delay and calculating delay of the first cell based on the first and second set of spacings.

12. The computer program product of claim 9 wherein the internal shape comprises a polysilicon transistor shape.

13. A system for performing delay calculations, the system comprising:

a processor; and a memory coupled to the processor, the memory configured to store a set of instructions which when executed by the processor cause the processor to:

receive information specifying an integrated circuit;

determine a neighborhood of shapes associated with the integrated circuit based on:

determining a first set of spacings between a boundary of an internal shape of a first cell and a boundary of the first cell;

determining a second set of spacings between the boundary of the first cell and a boundary of a shape of a second cell; and characterizing a lithography process using the first and second set of spacings; and generate delay information associated with the integrated circuit based on calculating delay in the integrated circuit using a simulation of the characterized lithography process.

14. The system of claim 13 wherein the processor is caused to characterize effective transistor channel lengths as a function of the first and second set of spacings to characterize the lithography process.

15. The system of claim 13 wherein the processor is further caused to generate a mapping from the first and second set of spacings to the lithography process.

16. The system of claim 13 wherein the processor is further caused to generate a mapping from the first and second set of spacings to delay and calculate delay of the first cell based on the first and second set of spacings.

17. The system of claim 13 wherein the internal shape comprises a polysilicon transistor shape.

* * * * *